United States Patent
Hesse et al.

(10) Patent No.: US 9,245,652 B2
(45) Date of Patent: Jan. 26, 2016

(54) LATENCY DETECTION IN A MEMORY BUILT-IN SELF-TEST BY USING A PING SIGNAL

(71) Applicant: ADVANCED MICRO DEVICES, INC., Sunnyvale, CA (US)

(72) Inventors: Kay Hesse, Dresden (DE); Suresh Periyacheri, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 197 days.

(21) Appl. No.: 13/863,965

(22) Filed: Apr. 16, 2013

(65) Prior Publication Data

US 2013/0232385 A1  Sep. 5, 2013

Related U.S. Application Data

(62) Division of application No. 12/709,605, filed on Feb. 22, 2010, now Pat. No. 8,458,538.

(30) Foreign Application Priority Data

Feb. 27, 2009  (DE) .................... 10 2009 010 886

(51) Int. Cl.
*G11C 29/38* (2006.01)
*G11C 29/02* (2006.01)
*G11C 29/12* (2006.01)
*G11C 29/50* (2006.01)

(52) U.S. Cl.
CPC ............... *G11C 29/38* (2013.01); *G11C 29/02* (2013.01); *G11C 29/023* (2013.01); *G11C 29/12* (2013.01); *G11C 29/50* (2013.01); *G11C 29/50012* (2013.01)

(58) Field of Classification Search
CPC ............. G11C 29/12015; G11C 29/00; G11C 29/56012; G11C 29/38; G11C 29/12; G11C 29/012; G11C 29/02; G11C 29/023
USPC .......... 714/700, 704–707, 710, 711, 718–724
See application file for complete search history.

(56) References Cited

U.S. PATENT DOCUMENTS

| | | | |
|---|---|---|---|
| 4,876,685 A | | 10/1989 | Rich |
| 5,053,698 A | * | 10/1991 | Ueda .............................. 714/736 |
| 5,682,472 A | * | 10/1997 | Brehm et al. ..................... 714/25 |
| 5,912,901 A | | 6/1999 | Adams et al. |
| 5,923,676 A | | 7/1999 | Sunter et al. |
| 6,586,962 B2 | * | 7/2003 | Sakurai et al. ................... 326/16 |
| 6,622,269 B1 | * | 9/2003 | Ngo et al. ...................... 714/718 |
| 6,996,032 B2 | * | 2/2006 | Ganry ........................... 368/118 |
| 7,519,891 B2 | | 4/2009 | Zimmerman |
| 7,607,060 B2 | | 10/2009 | Gorman et al. |

(Continued)

OTHER PUBLICATIONS

Translation of Official Communication from German Patent Office for German Patent Application No. 10 2009 010 886.6 dated Mar. 10, 2010, 2 pages.

*Primary Examiner* — Steve Nguyen

(57) ABSTRACT

In a complex semiconductor device including embedded memories, the round trip latency may be determined during a memory self-test by applying a ping signal having the same latency as control and failure signals used during the self-test. The ping signal may be used for controlling an operation counter in order to obtain a reliable correspondence between the counter value and a memory operation causing a specified memory failure.

13 Claims, 5 Drawing Sheets

(56) References Cited

U.S. PATENT DOCUMENTS

| | | |
|---|---|---|
| 7,650,554 B2 | 1/2010 | Goldrian et al. |
| 7,739,572 B2 * | 6/2010 | Kang ............................ 714/738 |
| 2002/0073363 A1 * | 6/2002 | Abrosimov et al. ............ 714/42 |
| 2003/0191995 A1 * | 10/2003 | Abrosimov et al. .......... 714/719 |
| 2004/0044491 A1 | 3/2004 | Yonaga et al. |
| 2007/0150777 A1 | 6/2007 | Sasaki |

* cited by examiner

LATENCY DETECTION IN A MEMORY BUILT-IN SELF-TEST BY USING A PING SIGNAL

CROSS-REFERENCE TO RELATED APPLICATIONS

This application is a divisional of co-pending U.S. patent application Ser. No. 12/709,605 filed Feb. 22, 2010, which claims priority to German Application No. 10 2009 010 886.6 filed Feb. 27, 2009.

BACKGROUND OF THE INVENTION

1. Field of the Invention

The present disclosure generally relates to techniques for testing semiconductor devices, and, more particularly, to techniques for testing integrated circuits that include logic circuitry portions and embedded memory portions with memory built-in self-test logics connected thereto.

2. Description of the Related Art

In manufacturing semiconductor devices including relatively complex circuitry, the testing of the device may represent a part of the manufacturing process which is frequently underestimated in terms of cost and effort required to obtain reliable data with respect to proper functionality and reliability of the device. One reason in failing to meet performance specifications of the integrated circuit may reside in design errors that may be identified and remedied by circuit verification on the basis of software simulation and/or prototype testing prior to mass production of the integrated circuits under consideration. An improper functionality of the integrated circuit may further be caused by the manufacturing process itself when the completed circuitry does not correspond to the verified circuit design owing to process fluctuations in one or more of the very large number of process steps. Although measurement and test procedures are incorporated at many points in the manufacturing process, it is nevertheless extremely important to ascertain the correct functioning of the final semiconductor device, since, according to a common rule of thumb, the costs caused by defective chips increase with each assembly phase by approximately one order of magnitude. For example, the costs caused by a defective circuit board including a faulty chip are typically significantly higher than identifying a defective chip prior to shipping and assembling the circuit board. The same holds true for a system, when a failure thereof is caused by one or more defective circuit boards, as a downtime of an industrial system may result in averaged costs of approximately several hundred dollars per minute compared to a price of a few dollars for an integrated circuit chip having caused the defect.

Hence, there is a vital interest in developing test procedures to identify as many defects as possible in completed integrated circuits while not unduly increasing the total manufacturing costs. In particular, with the demand for more features and lower costs of circuits, there is a tendency to integrate a plurality of different circuit portions into a single chip to provide a complete system on a chip (SOC). A semiconductor device comprising various functional blocks may typically include, in addition to one or more logic blocks, one or more embedded memory portions, such as are used as on-chip cache for CPUs or as buffers for data packets that are transferred between different clock domains.

As discussed above, economic constraints force semiconductor manufacturers to not only minimize the defect level of the total manufacturing process, but also to provide, in combination with a reduced defect level, a high fault coverage so as to reduce the delivery of defective chips at reasonable cost for appropriate test procedures and techniques. For moderately complex integrated circuits, it has become standard practice to develop the basic design of the circuit while taking into consideration a plurality of constraints posed by effective test procedures. Moreover, typically, additional hardware resources are provided in the chip that may enable the identification of faulty circuit components for a broad class of operating conditions, wherein the additional hardware resources, in combination with design specifics of the basic circuit and sophisticated test procedures and test patterns, substantially determine the fault coverage of the test procedure.

In many circuit designs, the functional logic portion is tested by so-called scan chains, which represent a chain of flip-flops connected to a specific area of the functional logic in such a way that the functional logic or a specific area thereof may be initialized with a desired state that has previously been entered into the scan chain. Moreover, upon providing one or more clock signals to the functional logic, the state thereof, that is the state of each logic gate connected to a dedicated flip-flop of the scan chain, may then be stored in the scan chain and may be shifted out by supplying respective shift clock signals to the scan chain. Depending on the bit pattern or input vector entered into the scan chain for initializing the functional logic, corresponding faulty logic gates may be identified. However, the fault coverage, i.e., the potential for identifying any error within the functional logic, significantly depends on the design, selection and number of appropriate scan chains and suitable input vectors. In principle, such scan test techniques may also be modified to include the testing of memory portions, wherein, however, only for small memories, appropriate scan test patterns, i.e., the number and size of appropriate input vectors, may exhibit a size that allows the testing of memory portions within acceptable time intervals.

For this reason, frequently, a so-called memory built-in self-test (MBIST) logic is provided as an additional hardware resource within a chip to implement a memory test procedure requiring fewer clock cycles and supporting the testing of important extended fault models that are specific to memories. With reference to FIGS. 1a-1c, the configuration and the test procedures for a representative conventional semiconductor device including functional logic and a memory portion are described in more detail so as to more clearly illustrate the problems involved.

FIG. 1a schematically shows a circuit diagram of a semiconductor device 100 including a functional logic circuitry 110, which may be connected to a memory portion 120 via write lines, read lines and control lines that are commonly referred to as lines 121. The device 100 further comprises an MBIST logic 130 including, for instance, a finite state machine 131 for implementing a desired algorithm for testing the memory portion 120. The MBIST logic 130 further comprises all components required for disconnecting the memory portion 120 from the functional logic 110 so as to enable the operation of the memory portion 120 fully under control of the MBIST logic 130 when operating the logic 130 for the memory test.

On the other hand, when disabled, the MBIST logic 130 is "transparent" for the lines 121 to allow proper operation of the logic circuitry 110 in combination with the memory portion 120. The MBIST logic 130 comprises a first control input 132, which is also referred to as MBIST-start, and a second control input 133, also indicated in the drawing as MBIST-enable. Moreover, a first output 134, also referred to in the drawing as MBIST-good, and a second output 135, also indicated as MBIST-done, are provided in the MBIST logic 130. It should be noted that, for convenience, any additional inputs or outputs of the logic 130, such as clock inputs, reset inputs and other control lines, are not shown.

When operating the device 100 in a memory test mode, the MBIST logic 130 may be enabled by providing a corresponding signal at the input 133 (MBIST-enable) to disconnect the memory portion 120 from the surrounding logic circuitry 110. By supplying a corresponding signal at the input 132 (MBIST-start), the circuit portion 130 is started to generate address values and to write data into the memory portion 120. The circuit 130 may also include a comparator, which may be configured to check if the data written into the memory 120 may be correctly read back from the memory, and which may provide a corresponding value at the output 134 (MBIST-good). For instance, the value of the output 134 may show logic "0" as long as no error occurs in writing data into the memory 120 and reading back the data, while the output 134 may be set to a logic "1" once a mismatch between the actually read data and the expected data is detected. After the test of the memory 120 is completed, a corresponding signal may be presented at the output 135 (MBIST-done), for instance, the output 135 may be switched from logic "0" to logic "1" if the test is completed.

FIG. 1b schematically illustrates the semiconductor device 100 which may comprise a plurality of embedded memories 120A, 120B that are connected to corresponding portions of the built-in test circuitry. For example, each of the memory portions 120A, 120B may be connected to a corresponding "glue logic" 140A, 140B, which may provide control and data signals to the memory 120A, 120B during a corresponding test phase and which may provide the desired transparency of the built-in test circuitry in a standard operating mode, as previously discussed. Moreover, corresponding circuit portions 160A, 160B may connect to the glue logics 140A, 140B, respectively, in order to provide appropriate control signals and test data patterns as required by the test algorithm under consideration. For convenience, the circuit portions 160A, 160B may also be referred to as "slaves," which in turn may be controlled by an MBIST controller 138, which in turn may be configured to provide appropriate operation code sequences for performing a desired sequence of memory operations in each of the memories 120A, 120B and which may also provide the required test data patterns. It should be appreciated that a plurality of test algorithms are presently used, each of which may provide a certain degree of fault coverage with respect to individual memory cells and also corresponding circuit components for controlling the memory arrays. For example, test algorithms may be applied in which each memory cell may be written to and may be read out according to a specified addressing scheme, while in other cases appropriate patterns may be written into the memory array, such as a checkerboard pattern and the like, in order to determine the static and dynamic behavior of the memory area and the associated circuitry for performing the read and write operations. It should be appreciated that respective test algorithms may be specifically designed for certain types of memories, technology standards used for actually fabricating the memories and the like, so that, with a change in memory design, technology and the like, appropriately adapted test algorithms may be required. Consequently, in many built-in test circuits, a certain degree of flexibility may be provided so as to allow the employment of different types of test algorithms, if required.

During operation, the semiconductor device 100 in a memory test operating mode, the controller 138 may instruct one or more of the slaves 160A, 160B to initiate a memory self-test by providing a corresponding sequence of instructions, such as memory addresses and respective control signals in combination with the desired test data pattern, which may be accomplished by conveying the signals via bus lines 150A, 150B, which may also include appropriate bus lines for conveying a failure signal from the glue logic 140A, 140B to the slaves 160A, 160B. It should be appreciated that the signal transmission via the busses 150A, 150B may typically be associated with a certain latency, i.e., the transport of the signal may require a specified number of clock cycles corresponding to the number of pipeline stages that may typically be used in order to relax time constraints as may typically occur in sophisticated semiconductor devices, which may be operated with clock frequencies of several hundred megahertz and significantly higher. Consequently, the point in time of issuing a certain memory operation from the slave 160A, 160B to the glue logic 140A, 140B may differ from the point in time when a corresponding memory operation may actually be served in the memory 120A, 120B. Upon executing the memory operations, for instance writing a specified data pattern into the memory array 120A, 120B and reading back the corresponding data according to a specified test algorithm, a comparison may be made between the originally written bus data and the data read out from the memory 120A, 120B and thereby detecting corresponding memory failures depending on the test algorithm used. The comparison result, for instance, obtained on the basis of a comparing logic 141A may then be forwarded to the slave 160A, 160B, which may also require a certain number clock cycles, depending on the overall configuration of the buses 150A, 150B, as previously explained. For an enhanced evaluation of any memory failures that may be detected during the test algorithm under consideration, at least the correspondence between a failure signal obtained in the slave 160A, 160B and a corresponding memory operation causing the failure signal may have to be determined, which, however, requires an appropriate adaptation of the various time delays involved in transferring the operation code instructions, the test data patterns and the failure signals from the slave 160A, 160B to the glue logic 140A, 140B and back to the slave. Moreover, in many cases, additional information is obtained, for instance, the form of each of the comparison results 141A obtained from the memory 120A at the point in time where a certain memory failure, for instance a read memory failure, is detected. For example, this information may be read out and may finally be transferred to the controller 138, from which the single global failure signal 135 may be obtained, for instance for an external test equipment, and also a corresponding bitmap 138A may also be supplied to an external test equipment via any appropriate interface system.

FIG. 1c schematically illustrates a portion of the semiconductor device 100 including the memory portion 120A and the glue logic 140A, the control and data busses 150A and the slave circuit 160A. As illustrated, the slave circuit 160A comprises a decode unit 166, which represents any appropriate circuit for providing control and operating code data 161 to the glue logic 140A. For example, addresses and control signals may be provided so as to perform a predefined sequence of memory operations, for instance, writing a specific data pattern into the memory 120A, reading specified memory locations and the like. The data 161 is transmitted through the bus 150A, thereby experiencing a certain degree of latency, which may be caused by the presence of a specific number of pipeline stages 151, which may be required in view of timing constraints and the like. Additionally, appropriate test data 162 are provided by the slave circuit 160A, for instance by operating a specified logic circuitry, which may evaluate a sequence of data, by receiving appropriate test data patterns from memory and the like. The data 162 is also transferred to the glue logic 140A through bus 150A including the specified number of pipeline stages 151. The control data 161 may be supplied to the memory 120A in order to initiate a corresponding sequence of memory operations, such as a sequence of write operations using the test data 162, that is supplied to the memory 120A by means of any appropriate circuit, such as a multiplexer 142, and the like. At the same time, the test data 162 may also be supplied to a latency adaptation stage 143, which may thus impart a specified latency to the test data that is equal to the latency experienced by the test data when subjected to corresponding memory operations initiated by the control and address data 161. Consequently, the data 162 as output by the adaptation stage 143 may be considered as reference data that can be compared to memory data 162M that are obtained by performing respective read operations in accordance with the test algorithm under consideration. For example, the comparison may be performed on the basis of exclusive OR gates 141A, 141B, thereby obtaining a comparison result for a portion of the data 162M. It should be appreciated that, due to the increased width of sophisticated memories, such as memory 120A, typically each item of the data 162M, 162R may represent an appropriate number of individual bit values, which may individually be compared, thereby providing a corresponding bitmap, which may be considered as the entirety of bit values representing the result of the comparison between the data 162M and 162R. For example, the corresponding result data or bitmap may be stored in a register 141C. Consequently, for a definition as used above, each logic 1 in the register 141C may represent a corresponding memory failure at a given point in time, thereby obtaining a topographical overview of the memory 120A for each global failure state, which may be indicated by a failure signal 141D obtained on the basis of an OR gate 141E, which may therefore assert the signal 141D upon occurrence of one or more individual failure bits in the register 141C. The failure signal 141D is then applied to the slave circuit 160A via a corresponding line 152, which in turn may also comprise a specific number of pipeline stages. The failure signal 141D may trigger a failure counter 164 in order to monitor the number of memory failures obtained during the corresponding test algorithm. The failure counter 164 in turn may lock an operation counter 163, which may count the number of operations issued to the glue logic 140A after starting the test algorithm under consideration. Consequently, the value of the counter 163 is indicative of the number of memory operations that resulted in the generation of a corresponding global failure indicated by the signal 141D. However, due to the various latencies induced by the pipeline stages 151, 152, the value of the counter 163 may not directly indicate the specific read operation that causes the failure under consideration. In order to obtain a reliable correspondence between the value of the counter 163 and a corresponding memory operation under consideration for a specified memory failure, respective design measures may have to be taken, such as appropriately adapting the pipelines 151 and 152, inserting a predefined number of wait cycles in the counter 163 in order to balance any latency differences of the corresponding signal line and the like. As previously discussed, during the design and verification of complex integrated circuits, it may frequently be desirable to add additional pipeline stages, for instance in view of superior signal routing and the like, in particular where semiconductor devices are considered that are operated based on high clock frequencies, which, however, may require a total redesign for a built-in self-test circuit in order to provide the required consistency between the bitmap obtained on the basis of the register 141C and the corresponding failure signal 141D. That is, by adding additional pipeline stages in a late design state, the corresponding delicate balancing of the pipelines 151, 152 required for appropriately associating a memory operation with a corresponding bitmap, or the incorporation of appropriate wait cycles, and the like may no longer be appropriate, thereby requiring the redesigned pipelines stages.

In view of the situation described above, the present disclosure relates to semiconductor devices and methods for operating the same in which flexibility in designing memory built-in self-test circuits may be enhanced by avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and methods in which enhanced flexibility may be achieved with respect to providing additional pipeline stages during the design phase of the semiconductor device by implementing a mechanism for determining the round trip latency involved for providing control and data signals to the memory and receiving the corresponding failure signals. For this purpose, the round trip latency may be determined prior to performing a test algorithm and the corresponding measure of the round trip latency may then be used for associating a failure signal and a corresponding memory read operation independent from the specific configuration of pipeline stages used for connecting the control to the memory area. In some illustrative aspects disclosed herein, the round trip latency may be "measured" by generating an appropriate measurement signal, which may also be referred to herein as a "ping" signal, that may be routed to the memory and back to a control circuit on the basis of a signal path experiencing the same latency as the corresponding control and data signals used for performing the actual test algorithm. In one illustrative embodiment disclosed herein, the ping signal may be routed to the memory and back to the control circuit by using signal lines, which are also used for the regular self-test algorithm. Hence, the same latency may be imparted to the ping signal and to the control and failure signals, thereby avoiding any effects of additional pipeline stages that may have to be implemented in a late stage of the overall design. In similar illustrative embodiments, the ping signal may be used to control an operation counter, so that this counter may contain a counter value that corresponds to the interval between the start of the actual test algorithm and the occurrence of a failing read operation as "seen" by the memory array.

One illustrative semiconductor device disclosed herein comprises a memory portion and a memory built-in self-test (MBIST) circuitry connected to the memory portion. The MBIST circuitry is configured to perform a memory self-test by reading out the memory portion and comparing read results with a reference data to provide comparison results so as to identify a plurality of memory failures. Additionally, the semiconductor device comprises a latency detection circuit provided in the MBIST circuitry and configured to determine a time interval from the start of a test algorithm of the memory portion and occurrence of a predefined failure of the plurality of memory failures.

One illustrative method disclosed herein relates to performing a memory self-test of a memory portion of a semiconductor device. The method comprises determining a round trip latency of control signals and a failure signal exchanged between the memory portion and a memory built-in self-test (MBIST) circuit prior to a first run of a test algorithm, wherein the test algorithm causes the MBIST circuit to perform a plurality of memory operations and compare a result data of the plurality of memory operations with a reference data to determine a plurality of memory failures. The method further comprises obtaining a failure bitmap of the memory portion for a selected one of the plurality of memory failures on the basis of the round trip latency by performing a second run of the test algorithm.

A further illustrative method disclosed herein comprises sending a ping signal from a test circuit of a semiconductor device to a memory area of the semiconductor device via a control line bus connecting the test circuit with the memory area, wherein the memory area accommodates a memory portion of the semiconductor device. The method further comprises passing at least a portion of the ping signal through a latency adaptation circuit so as to obtain substantially the same process latency for the at least a portion of the ping signal and for control and data signals to be processed in the memory area. Additionally, the at least a portion of the ping signal is returned to the test circuit via a failure signal line. The method further comprises performing a memory self-test algorithm by sending a sequence of memory operations and test data to the memory area via the control line bus and a data line bus. Additionally, the method comprises controlling an operation counter on the basis of the returned portion of the ping signal and a failure signal that indicates the occurrence of a memory failure.

BRIEF DESCRIPTION OF THE DRAWINGS

The disclosure may be understood by reference to the following description taken in conjunction with the accompanying drawings, in which like reference numerals identify like elements, and in which.

Figure 1A:
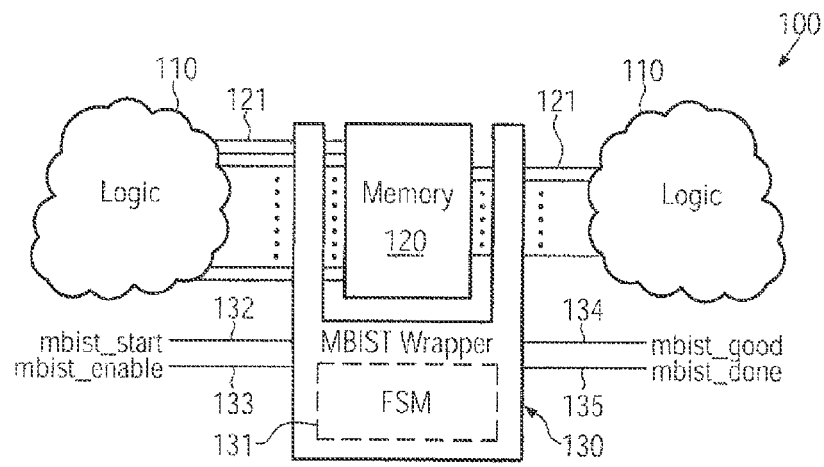
FIG. 1a schematically illustrates a circuit diagram of a semiconductor device including an MBIST circuit for providing a single fail/good signal, according to conventional techniques.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and methods for operating the same in which a round trip latency may be "compensated for," i.e., the influence thereof for obtaining a reliable correspondence between a failure signal and a read operation causing the failure may be avoided, thereby enabling the implementation of additional pipeline stages at a late stage of the overall design of the semiconductor device. For this purpose, in some illustrative embodiments, a measurement signal or ping signal is generated prior to actually starting the test algorithm under consideration and may be conveyed to the memory area under consideration and back to the control circuit by using signal lines resulting in the same degree of latency compared to the latency experienced by actual control and data signals. In one illustrative embodiment, the ping signal may be conveyed by means of control and signal lines, which may also be employed when performing the actual test algorithm so that the ping signal may pass the same pipeline stages as the actual control and data signals. Furthermore, the signal processing in the memory area, possibly in combination with a delay caused by an additional glue logic for obtaining and comparing the memory data, may be compensated for by using the ping signal by imparting a corresponding latency to the ping signal so that the overall round trip latency of the ping signal is substantially equal to the round trip latency for the combination of control signals, memory data signals and failure signals. Consequently, the ping signal may be efficiently used to determine the point in time when a corresponding sequence of memory operations actually starts at the memory area and, thus, when the corresponding memory failure signal is detected, which thus represents the entire round trip latency for routing control and status signals to the memory area, processing the data and generally create the failure signal. Hence, the occurrence of the failure as seen by the memory area may be obtained on the basis of the round trip interval indicated by the ping signal. For example, in some illustrative embodiments, during a first round of a test algorithm, the ping signal may be passed through the control signal bus from the control circuit to the glue logic, i.e., to the memory area accommodating the memory of interest and back to the control circuit prior to issuing a sequence of corresponding memory operations. Although a plurality of memory operations may be issued prior to receiving the ping signal, a corresponding operation counter may be prevented from counting until the ping signal is finally received in the control circuit. Upon receiving the ping signal, the operation counter may be enabled to count the cycles in the first round of the test algorithm. When a failure signal is detected, the operation counter may be stopped and locked so that the counter value corresponds to the interval between the start of the algorithm and the failing read operation as seen at the memory portion under test, irrespective of any intermediate latencies. This mechanism may be insensitive to a variation of pipeline stages during the process of designing and verifying a semiconductor device, thereby providing enhanced design flexibility.

Figure 1B:
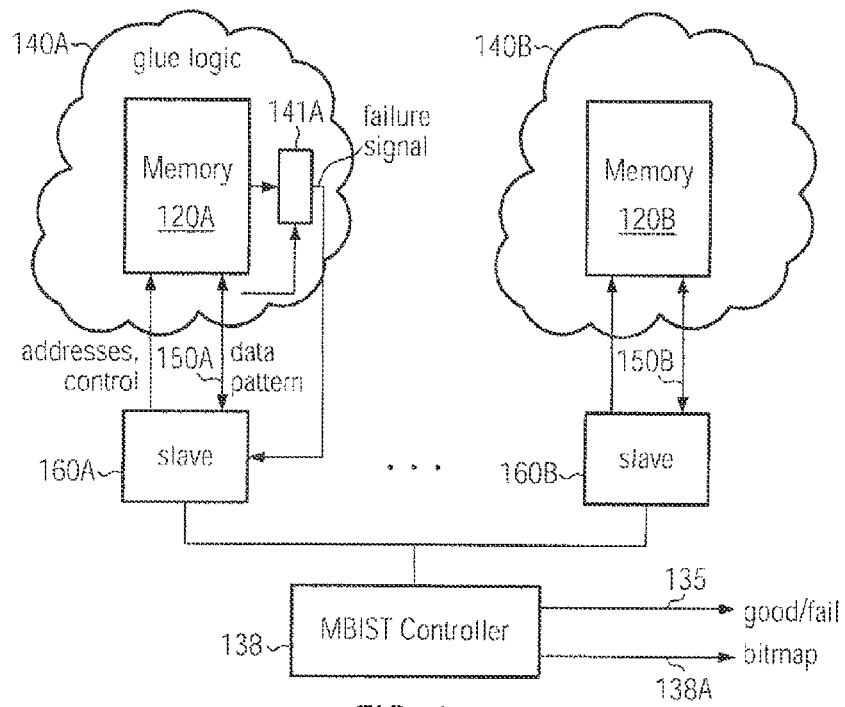
FIG. 1b schematically illustrates a circuit diagram of an MBIST circuit including a controller and a plurality of embedded memories and associated slave test circuits, according to conventional designs.
Figure 1C:
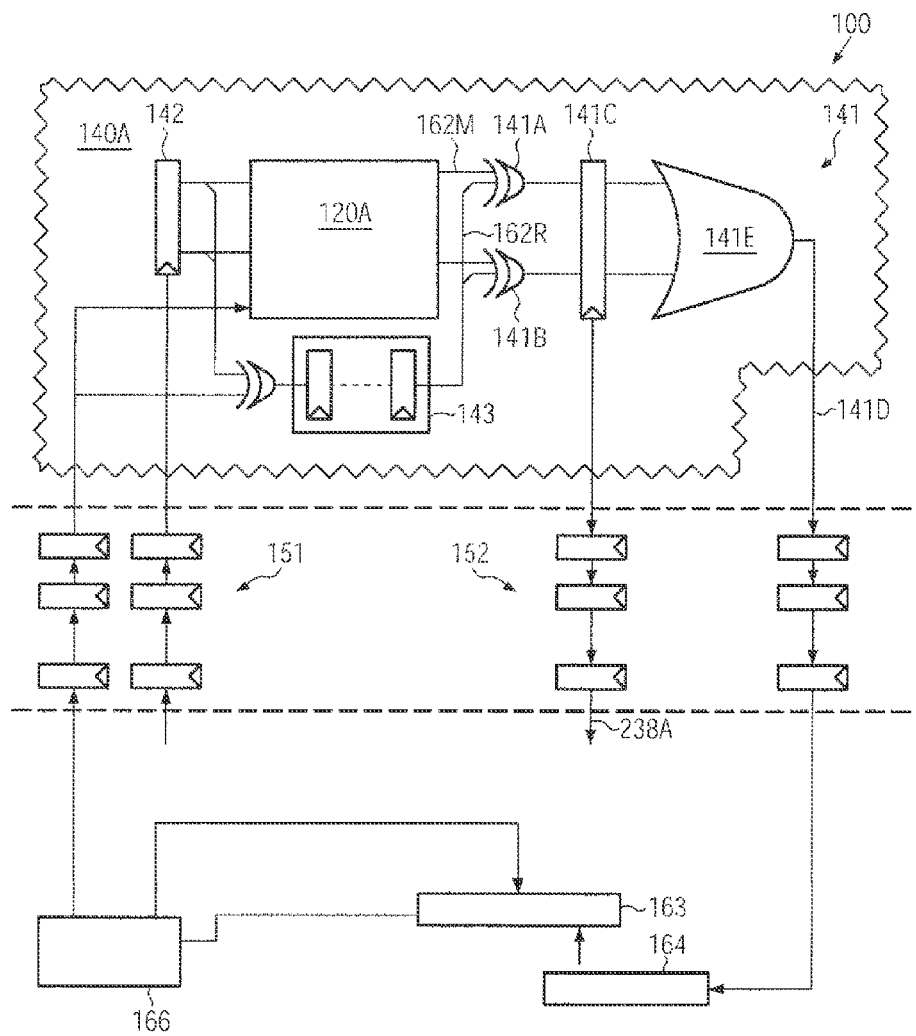
FIG. 1c schematically illustrates a more detailed circuit diagram for illustrating latency related problems and obtaining a bitmap for memory failures, according to conventional techniques.
Figure 2A:
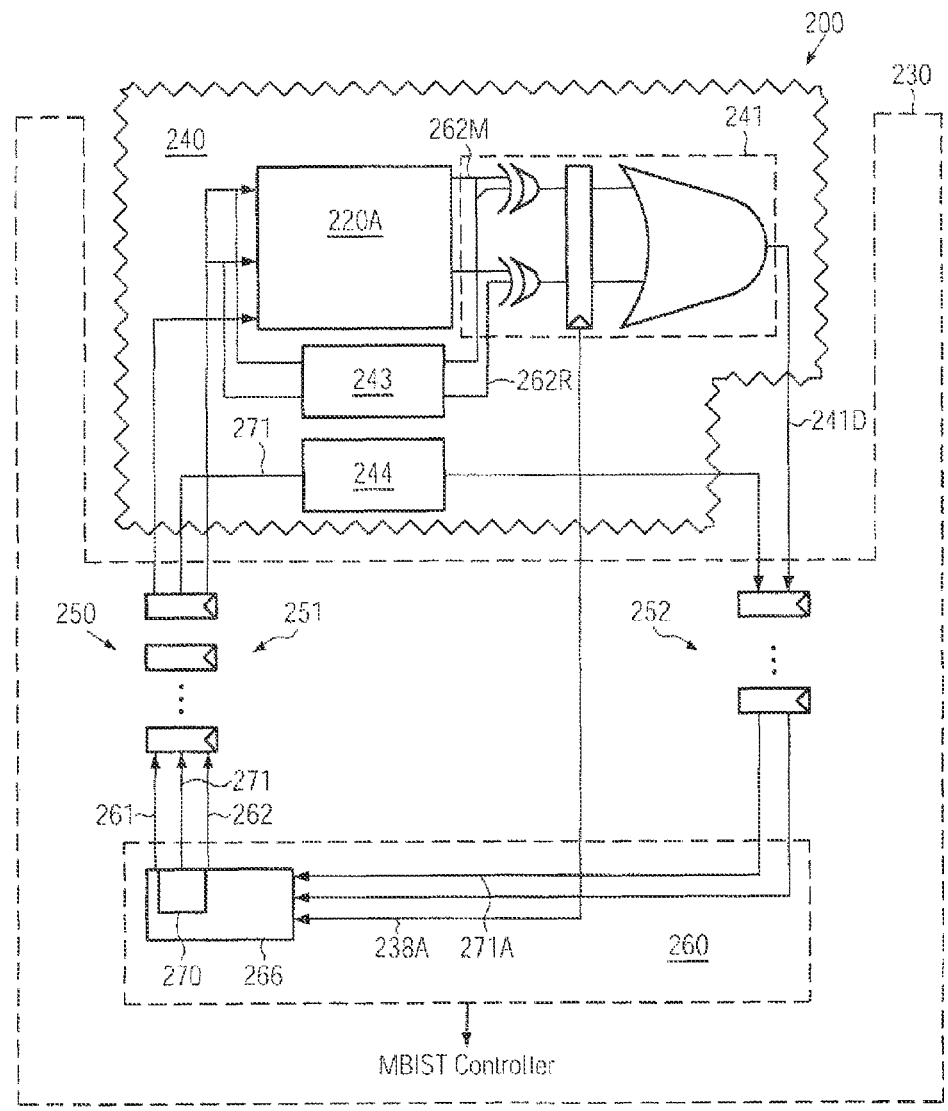
FIG. 2a schematically illustrates a circuit diagram representing an MBIST circuit that is configured to determine a round trip latency, according to illustrative embodiments.
Figure 2B:
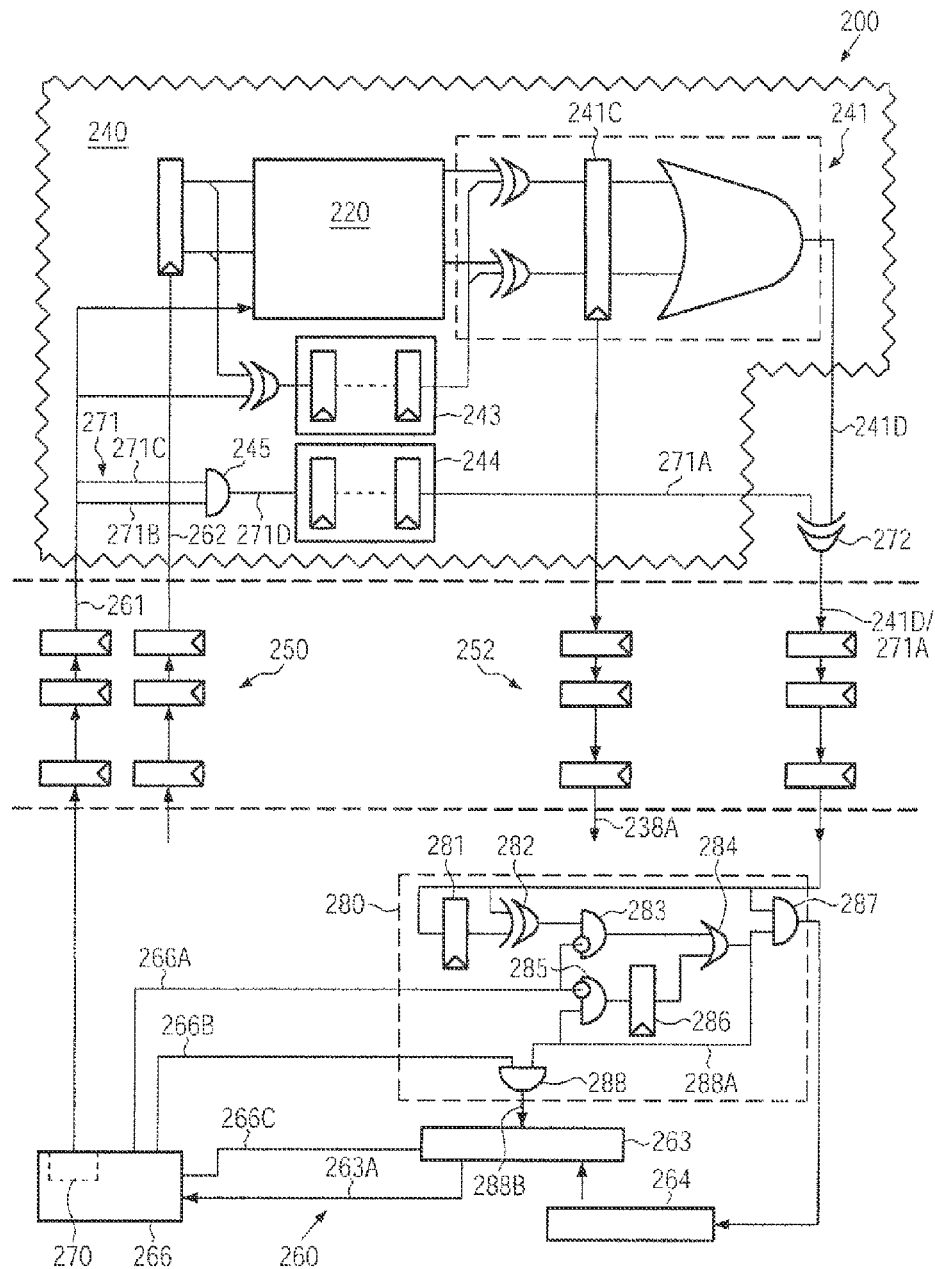
FIG. 2b schematically illustrates a circuit diagram of an MBIST circuit where round trip latency is compensated, according to still further illustrative embodiments.
Figure 2C:
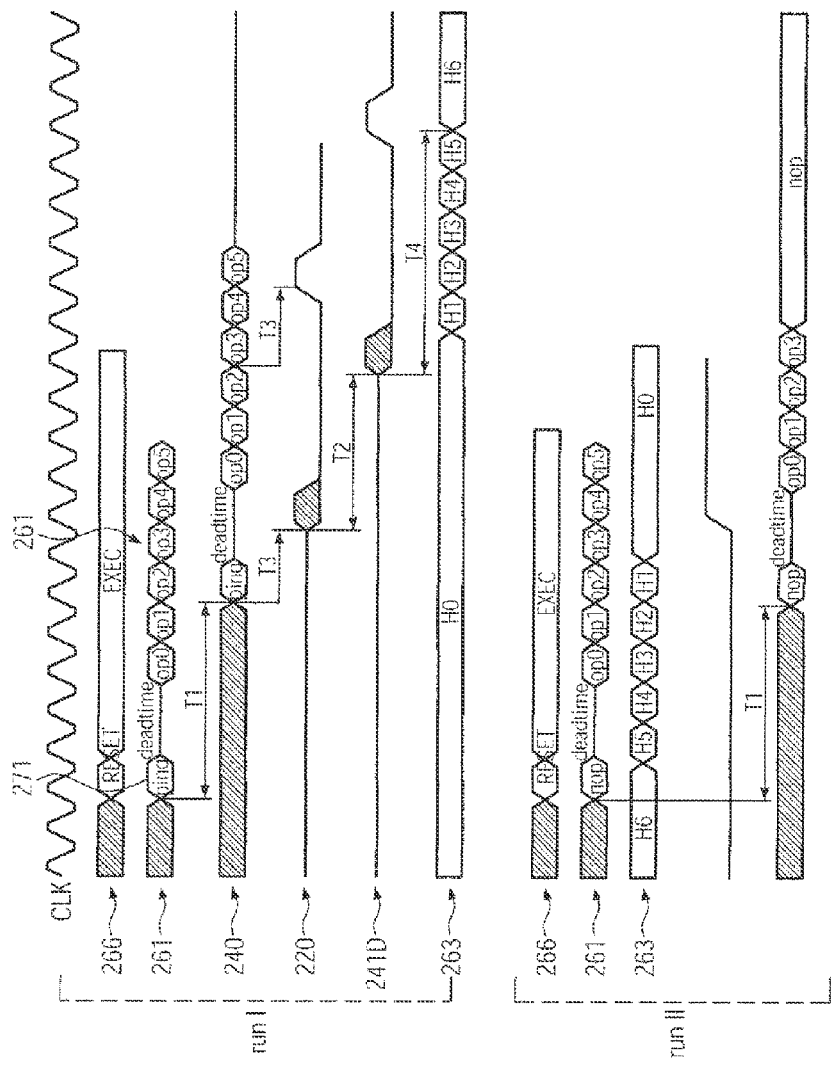
FIG. 2c illustrates a sequence of events during a test algorithm for obtaining a bitmap upon occurrence of an $n^{th}$ memory failure with compensated round trip latency, according to illustrative embodiments.

With reference to FIGS. 2a-2c, further illustrative embodiments will now be described in more detail, wherein reference may also be made to FIGS. 1a-1c, if appropriate.

FIG. 2a schematically illustrates a circuit diagram representing a semiconductor device 200 comprising a memory 220, for instance in the form of any type of embedded memory portion such as a RAM (random access memory), in the form of a static or dynamic RAM, a non-volatile memory, and the like. Furthermore, the semiconductor device 200 may comprise an MBIST circuit 230 that is configured to perform one or more test algorithms, as previously explained. It should be appreciated that FIG. 2a should represent the electric configuration of the MBIST circuit 230 and may also represent an actual implementation in an appropriate substrate for forming semiconductor devices. That is, individual circuit elements, such as transistors and the like, may be formed in an appropriate semiconductor material in accordance with the electric characteristics as illustrated by the circuit diagram in FIG. 2a. To this purpose, any appropriate manufacturing technique may be used, such as CMOS techniques, techniques for MOS transistors and bipolar transistor and the like, wherein mixed signal devices may also be included, as long as the embedded memory 220 may be provided and may require an efficiently built-in test environment. As illustrated, the MBIST circuit 230 may be connected to the memory 220 by a corresponding glue logic 240, which may represent any electronic components for interfacing the memory 220, wherein it should be appreciated that the glue logic 240 may represent a memory area of the device 200 accommodating the actual memory array, i.e., a corresponding array of memory cells, and the respective control logic required to perform memory operations in the array, i.e., writing data into and reading data out of specific memory locations. Consequently, the signal processing in the memory area 220 and within the glue logic 240 may result in similar signal propagation delay, for instance, for switching transistors and the like, since these components may be formed in close proximity to each other. Moreover, the MBIST circuit 230 may comprise an appropriate control circuit that may locally control the testing of the memory 220, wherein as previously discussed with reference to FIG. 1b, a plurality of circuits 260, from now on to be referred to as slave circuits, may be provided when a plurality of embedded memories are provided in the semiconductor device 200. For example, the circuit 260 may be connected to an MBIST controller that may coordinate a plurality of circuits 260, as previously explained. Furthermore, the circuit 260 and the glue logic 240 may be connected by a signal line 250, which from now on shall be referred to as control and signal bus lines, which may, however, include any number of pipeline stages, such as indicated by pipelines 251, 252 as required by any timing constraints and the like. For example, the control and signal lines 250 may comprise a bundle of control lines 261, which may provide addresses and a sequence of commands initiating respective memory operations in the memory 220. It should be appreciated that, for convenience, signal lines and the corresponding signals or data may be referred to by the same reference number.

Moreover, data lines 262 may be provided to apply an appropriate test data pattern to the memory 220. The control signals including commands for performing memory operations 261 and test data patterns 262 may be obtained from a circuit portion 266, which in turn may be connected to any appropriate components for providing the required data. Moreover, in the embodiment shown, the circuit 266 may include a signal generator 270, which may also be referred to as a ping signal generator for providing an appropriate signal that may experience the same latency within the signal and bus lines 250 as any other signals transferred via the lines 250 when performing a specific test algorithm. In the embodiment shown, the ping signal generator 270 may be connected to a dedicated signal line 271 so as to provide the ping signal, while, in other illustrative embodiments, as will be described later on with reference to FIG. 2b, one or more of the signal lines 261, 262 may be used to supply the ping signal to the glue logic 240. Furthermore, the ping signal 271 may be connected to a latency adaptation stage 244 provided in the glue logic 240, wherein the stage 244 may comprise any appropriate number of pipelines stages so as to obtain substantially the same timing behavior compared to any data signals to be processed in the memory 220 or in a corresponding latency adaptation stage 243 for providing reference data 262R on the basis of the original bus data 262.

It should be appreciated that, contrary to the latency adaptation stage 243, which represents a number of reference stages corresponding to the latency in the memory 220, the adaptation stage 244 may also compensate for additional pipeline stages that may be involved with a failure detection circuit 241 of the glue logic 240. For example, the signal processing in the stage 241 for comparing memory data 262M with the reference data 262R may involve two or more pipeline stages, which may also be taken into consideration when establishing a respective number of pipeline stages of the stage 244. Consequently, the ping signal after the latency adaptation stage 244, indicated as 271A, may have the same latency as a failure signal 241D provided by the failure detection logic 241. Consequently, upon transfer via the pipeline stage 252, the signal 271A may represent the entire round trip latency caused by the lines 250, the memory 220 and the failure detection logic 241.

Upon operating the semiconductor device 200 in a test phase, the circuit 260 may provide the ping signal 271 at any appropriate phase, for instance, prior to issuing the signals 261 and 262, in order to determine the round trip latency, for instance, by controlling the counter upon issuing the signal 271 and receiving the signal 271A. On the basis of the determined round trip latency, a correspondence between the failure signal 241D and the state of the memory 220, for instance in the form of a bitmap 238A, that may be read out from the failure detection logic 241, as is also previously described with reference to FIG. 1c, may be established in a reliable manner irrespective of the number of pipeline stages in the bus system 250.

FIG. 2b schematically illustrates the semiconductor device 200 according to further illustrative embodiments in which the ping signal 271 may be conveyed to the glue logic 240 by means of the lines 261 and/or 262, as are also used during the standard memory self tests. Furthermore, the ping signal 271A may be conveyed by a signal line as may also be used during the standard memory self-test, thereby ensuring the same latency for the ping signal 271, 271A compared to control and data signal 261, 262 and signals applied from the glue logic 240 to the circuit 260. In the embodiment shown, the ping signal 271A having the appropriate latency caused by the stage 244 may be conveyed on the basis of the signal line 241D which may also be used for carrying a failure signal provided by the failure detection logic 241. For this purpose, an exclusive OR gate 272 may be provided to receive the failure signal 241D, which may be in a well-defined state upon injecting the ping signal 271 into the glue logic 240. Thus, upon sending the signal 271, the failure signal 241D may be asserted by means of the exclusive OR gate 272 and a corresponding impulse may be detected after passing through the pipeline stage 252 by a ping signal receiver 280. The circuit 280 may be configured to detect a corresponding toggling of the signal 241D, which may be caused by the ping signal 271A, while, on the other hand, an asserted state of the failure signal 241D may also be detected in order to act as the trigger impulse for a failure counter 264. To this end, the toggling of the signal 241D/271A during one clock cycle may be detected by the receiver circuit 280 while at the same time ensuring that the failure counter 264 may not be triggered by the ping signal 271A.

For example, in the embodiment shown, the circuit 266 including the ping signal generator 270 may provide the ping signal 271 at a reset phase, in which a reset state signal 266A may be asserted. The signal 266A holds an input signal 288A that is supplied to an AND gate 288 at a low level as long as the unit 266 is in the reset state. After transiting into the "execution" state of the unit 266, i.e., into a state for sending the ping signal 271 and starting to provide memory operations via the signal line 261, the signal 266A may be de-asserted. However, the de-asserted state of the signal 241D/271A may still hold the signal 288A at a low level, thereby further ensuring that an output 288B for triggering the operation counter 263 will be maintained at a low level, although a pulse 266B upon issuance of respective memory operations may be supplied to the AND gate 288. Consequently, the operation counter 263 is still prevented from counting up, although corresponding memory operations may be issued via the line 261. Thus, after a certain number of memory operations applied to the glue logic 240, the signal 241D/271A may be asserted during one clock cycle, and may result in an asserted state of an output of an exclusive OR gate 282 at this clock cycle, since the output state of a clocked register 281 is still in a logic low level. Thus, the AND gate 283 receives the output of the gate 282 and the inverse of the de-asserted signal 266A and may transit into the logic high level, which is supplied to an OR gate 284, the second input of which may still be at a logic low level due to the clocked register 286, which may still hold a logic low level obtained from an AND gate 285 in a preceding clock cycle. Thus, the output of the OR gate 284 results in the enabling of the operation counter 263 via the AND gate 288 so that counter 263 actually starts counting at a point in time in which the corresponding test algorithm actually starts at the memory 220.

Hence, the operation counter 263 starts counting upon receiving the first failure signal from the fault detection circuit 241 generated by a first read operation associated with this first failure signal. In this case, the input of an AND gate 287 receiving the signal 241D/271A and the output of the OR gate 284 may still maintain the trigger input of the failure counter 264 at a low level in this clock cycle, thereby avoiding an incrementing of the counter 264. Thereafter, the signal 241D/271A may transit into the logic low state and may now represent the failure status indicated by the circuit 241. In this case, signal 288A may still be maintained at a logic high level due to the clocked register 286, which may now be held at a logic high level. Consequently, the operation counter 263 remains enabled and continues to count the memory operations issued by the circuit 266. Hence, the signal 241D/271A may remain de-asserted as long as no failure is detected by the circuit 241, since the output of the AND gate 287 may still prevent the failure counter 264 from incrementing its counter value. Upon assertion of the signal 241D/271A, which thus represents occurrence of a memory failure, the AND gate 287 may trigger the counter 264 so that the counter value represents the number of failures detected by the circuit 241. By pre-selecting a desired failure, for instance the $n^{th}$ failure, the counter 264 may be appropriately trigged to disable the operation counter 263 and thus lock the corresponding counter value contained therein. Hence, the counter value corresponds to the $n^{th}$ failure detected by the circuit 241 and this counter value may be used for obtaining a corresponding bitmap from a register 241C in a subsequent run of the same test algorithm after completing the first run that may further continue, however, without affecting the operation counter 263.

In the embodiment described before, the ping signal generator 270 may be appropriately configured to establish the ping signal 271 on the basis of an appropriate combination of control signals that may not be used during a standard test algorithm. For example, a "write enable" signal in a de-asserted state and a "write inverse" signal in an asserted state may be supplied to the control lines 261 in the reset state and may be used as a unique combined signal 271. The unique control signal combination, indicated as 271C and 271B is applied to a decode unit 245 within the glue logic 240 in order to obtain a single ping signal 271D, which may than be supplied to the latency adaptation stage 244, as previously explained. It should be appreciated, however, that any other appropriate combination of standard control signals may be used in order to obtain a unique and thus reliably identifiable ping signal by means of the decode unit 245. Consequently, by using the same control and failure signals that are also used during the normal MBIST operation, it is guaranteed that the ping signal 271, 271D, 271A "sees" the same latency as the control and failure signals used during the MBIST algorithm.

In one illustrative embodiment, after performing a first run of a specified test algorithm, thereby locking the operation counter 263 on the basis of the ping signal 271A, as described above, a further run of the same test algorithm may be initiated, however, without applying the ping signal 271, wherein the circuit 266 may provide a signal 266C to the operation counter 263 in order to enable the decrementing of the counter value on issuing the memory operations. Upon reaching the counter value zero, the operation counter 263 may provide an output signal 263A to the circuit 266 in order to disable the issuance of further memory operations. Consequently, the state of the failure detection circuit 241, i.e., the register 241C thereof, may correspond to the state that caused the locking of the operation counter 263 in the previous run of the test algorithm when the associated $n^{th}$ failure has occurred. Consequently, the state of the register 241C may represent the desired bitmap corresponding to the $n^{th}$ failure. Consequently, since the further issuance of the memory operations may be reliably blocked on the basis of the signal 263A, the contents of the register 241C may be read out after completing the run of the test algorithm in order to obtain the bitmap 238A.

FIG. 2c schematically illustrates a timing diagram when operating the semiconductor device 200 as shown in FIG. 2b on the basis of a specific test algorithm and using at least two separate runs or rounds for executing a sequence of memory operations in order to obtain a bitmap for one of a plurality of memory failures. As illustrated, time is plotted along the horizontal direction in units of clock cycles CLK. As illustrated, the state of the unit 266 (FIG. 2b) may transit from a reset state into an execution state.

In the next line, the status of the control signals 261 is depicted, wherein the ping signal 271 may be generated during the reset phase of the circuit 266, as previously explained, and, after a certain constant dead time, memory operations 261 may be issued.

In the next line, the state of signals in the glue logic 240 are illustrated, wherein the time interval T1 represents the time required for transferring a control signal and the ping signal from the circuit 260 (FIG. 2b) to the glue logic 240.

The next line illustrates the time at the memory array 220 wherein the time interval T3 represents the time for reading the memory 220 including any possible pipeline stages in the failure detection circuit 241 (FIG. 2b).

The next line illustrates the state of the failure signal 241D, wherein the time interval T2 represents the time required for the processing in the pipeline stages 252 (FIG. 2b).

In the next line, the state of the operation counter 263 is illustrated, wherein T4 represents the time interval in which the counter 263 is enabled, that is, the time after receiving the ping signal and prior to receiving a signal representing the $n^{th}$ failure, at other times the counter 263 is hold and blocked until the test algorithm is completed. This counter value may then be sent to external test equipment for further failure analysis, since that counter value represents the corresponding memory operation that caused the respective failure under consideration.

During a second run of the test algorithm, the ping signal is not generated during the reset state of the circuit 266, as is indicated by "nop" in the status of control signals 261 during the reset phase. The operation counter 263 counts down from the previously counted and stored counter value, indicated as H6, until it reaches zero, i.e., the time interval it took from the first algorithm command reaching the failure detection circuit 241 until a failure has occurred. Once the operation counter 263 has reached the value zero, all further commands are blocked via the signal 263A (FIG. 2b), as is indicated by "nop" in the last line of the time diagram. Since all further memory operations are blocked, the bitmap corresponding to the $n^{th}$ failure may then be read out once a second round of the algorithm has been completed.

As a result, the present disclosure provides semiconductor devices and techniques for operating the same in which pipe line latencies do not need to be known upon designing the semiconductor device on the basis of the fundamental register transfer language, while nevertheless providing the possibility of adding additional pipeline stages for relaxing the timing constraints without negatively affecting the MBIST. Thus, contrary to conventional techniques, additional mechanisms required for subtracting the latency from the counter value for a second run of the test algorithm are not necessary. Similarly, any wait cycles that may conventionally have to be implemented into the design may not be necessary, which may conventionally be associated with a high risk of introducing timing errors. Furthermore, complex and delicate pipeline balancing techniques may no longer be required. Moreover, in some illustrative embodiments, the reliability of determining the round trip latency on the basis of a ping signal may be enhanced by using the very same control and failure signal lines as are also used during an actual self-test algorithm. Consequently, built-in self-test circuitry may be efficiently implemented into complex semiconductor devices without adding undue additional complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of performing a memory self-test of a memory portion of a semiconductor device, the method comprising:
   determining a round trip latency of control signals and a failure signal exchanged between said memory portion and a memory built-in self-test (MBIST) circuit prior to a first run of a test algorithm;
   performing the first run of the test algorithm to cause said MBIST circuit to perform a plurality of memory operations and to compare a result data of said plurality of memory operations with a reference data to determine a plurality of memory failures, wherein determining said round trip latency comprises generating a ping signal and conveying said ping signal on one or more signal lines used for conveying said control and failure signal; and
   obtaining a failure bitmap of said memory portion for a selected one of said plurality of memory failures on the basis of said round trip latency by performing a second run of said test algorithm.

2. The method of claim 1, wherein generating said ping signal comprises generating a control signal combination not used for performing said first and second runs of said test algorithm.

3. The method of claim 2, wherein generating said ping signal further comprises decoding said control signal combination into a single signal at said memory portion so as to impart the same latency to said single signal and said control signals to be transferred to said memory portion for performing said first and second runs.

4. The method of claim 3, wherein generating said ping signal further comprises processing said ping signal so as to add a processing latency to said ping signal, wherein said processing latency corresponds to a latency induced by performing said memory operations and obtaining a result of said comparison.

5. The method of claim 1, wherein said ping signal is conveyed via a failure signal line used to indicate said plurality of memory failures when performing said first and second runs.

6. The method of claim 1, wherein determining said round trip latency further comprises issuing said ping signal, issuing an operation code for performing said memory operations and starting a counter upon receiving said ping signal.

7. The method of claim 6, wherein said counter is an operation code counter.

8. The method of claim 6, wherein determining said round trip latency further comprises stopping said counter and locking a count number thereof upon detecting said selected memory failure.

9. The method of claim 8, wherein obtaining said failure bitmap comprises issuing said operation code of said memory operations during said second run and disabling issuance of said operation code after issuing a number of operations that is equal to said locked count number.

10. A method, comprising:
sending a ping signal from a test circuit of a semiconductor device to a memory area of said semiconductor device via a control line bus connecting said test circuit with said memory area, said memory area accommodating a memory portion of said semiconductor device;
passing at least a portion of said ping signal through a latency adaptation circuit so as to obtain an equal process latency for said at least a portion of the ping signal and control and data signals to be processed in said memory area;
returning said at least a portion of said ping signal to said test circuit via a failure signal line;
performing a memory self-test algorithm by sending a sequence of memory operations and test data to said memory area via said control line bus and a data line bus; and
controlling an operation counter on the basis of said returned at least a portion of the ping signal and a failure signal that indicates occurrence of a memory failure.

11. The method of claim 10, wherein controlling said operation counter comprises starting said operation counter upon detecting the returning of said at least a portion of the ping signal and locking said operation counter when detecting said memory failure.

12. The method of claim 11, wherein performing said memory self-test algorithm comprises performing a first run so as to execute said sequence of memory operations after sending said ping signal and performing a second run so as to execute subset of said sequence of memory operations, wherein said subset is controlled on the basis of a count value locked in said operation counter during said first run.

13. The method of claim 12, further comprising obtaining a bitmap of compare results after completing said second run.

* * * * *